(12) United States Patent
Lee et al.

(10) Patent No.: US 10,613,144 B2
(45) Date of Patent: Apr. 7, 2020

(54) SEMICONDUCTOR DEVICE

(71) Applicant: SAMSUNG ELECTRONICS CO., LTD., Suwon-si, Gyeonggi-do (KR)

(72) Inventors: Suh Ho Lee, Seongnam-si (KR); Ihor Vasyltsov, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 47 days.

(21) Appl. No.: 16/100,966

(22) Filed: Aug. 10, 2018

(65) Prior Publication Data

US 2019/0250209 A1 Aug. 15, 2019

(30) Foreign Application Priority Data

Feb. 12, 2018 (KR) .................... 10-2018-0016936

(51) Int. Cl.
*G01R 31/3177* (2006.01)
*G01R 31/317* (2006.01)

(52) U.S. Cl.
CPC ... *G01R 31/3177* (2013.01); *G01R 31/31703* (2013.01); *G01R 31/31725* (2013.01); *G01R 31/31727* (2013.01)

(58) Field of Classification Search
CPC .......... G01R 31/3177; G01R 31/31703; G01R 31/31725; G01R 31/31727
See application file for complete search history.

(56) References Cited

U.S. PATENT DOCUMENTS

| | | | |
|---|---|---|---|
| 7,188,326 B2 | 3/2007 | Yoshida | |
| 7,194,669 B2 | 3/2007 | Nadeau-Dostie | |
| 7,673,202 B2 * | 3/2010 | Chung | G01R 31/31816 714/726 |
| 8,412,991 B2 | 4/2013 | Ackerman et al. | |
| 8,917,123 B2 | 12/2014 | Bahl et al. | |
| 9,128,151 B1 | 9/2015 | Charlebois et al. | |

(Continued)

FOREIGN PATENT DOCUMENTS

| | | |
|---|---|---|
| JP | 2015206785 A | 11/2015 |
| KR | 0727975 | 6/2007 |

(Continued)

OTHER PUBLICATIONS

Pomeranz, I., "Improving the Diagnosability of Scan Chain Faults Under Transparent-Scan by Observation Points," IEEE Transactions on Computer-Aided Design of Integrated Circuits and Systems, vol. 37, Issue: 6, Jun. 2018, pp. 1278-1287, Date of Publication: Aug. 31, 2017. (Year: 2017).*

*Primary Examiner* — Kyle Vallecillo
(74) *Attorney, Agent, or Firm* — Volentine, Whitt & Francos, PLLC

(57) ABSTRACT

A semiconductor device includes a processing block which comprises one or more intellectual property (IP) blocks; a scan chain which is electrically connected to the IP blocks, wherein the scan chain block has a scan in (SI) terminal and a scan out (SO) terminal; a pattern generating circuit which generates a data pattern having a plurality of bits and inputs the data pattern to the scan in (SI) terminal of the scan chain; and an analyzing circuit which determines the degree of degradation of each of the IP blocks based on a result pattern output from the scan out (SO) terminal of the scan chain.

20 Claims, 18 Drawing Sheets

(56) References Cited

U.S. PATENT DOCUMENTS

| | | | |
|---|---|---|---|
| 9,188,643 B2 | 11/2015 | Charlebois et al. | |
| 9,323,320 B2 | 4/2016 | Fitzpatrick et al. | |
| 9,483,068 B2 | 11/2016 | Raja et al. | |
| 9,672,128 B2 | 6/2017 | Kang et al. | |
| 9,810,792 B2 | 11/2017 | Yoshikawa et al. | |
| 9,885,752 B2 | 2/2018 | Seuring et al. | |
| 10,247,777 B1* | 4/2019 | Bernard | G01R 31/3177 |
| 2005/0080581 A1* | 4/2005 | Zimmerman | G11C 5/04 |
| | | | 702/117 |
| 2007/0061621 A1 | 3/2007 | Bae | |
| 2007/0234157 A1* | 10/2007 | Rajski | G01R 31/31854 |
| | | | 714/728 |
| 2008/0034261 A1* | 2/2008 | Birmiwal | G01R 31/31853 |
| | | | 714/726 |
| 2009/0235134 A1* | 9/2009 | Guo | G01R 31/31854 |
| | | | 714/726 |
| 2010/0138707 A1* | 6/2010 | Yanagida | G01R 31/31853 |
| | | | 714/726 |
| 2015/0253384 A1* | 9/2015 | Chen | G01R 31/3177 |
| | | | 714/728 |
| 2015/0293173 A1* | 10/2015 | Tsuboi | G01R 31/3177 |
| | | | 714/727 |
| 2016/0231379 A1 | 8/2016 | Charlebois et al. | |
| 2017/0192053 A1* | 7/2017 | Jacquet | G01R 31/3177 |
| 2018/0080984 A1* | 3/2018 | Tsuboi | G01R 31/31854 |
| 2018/0341724 A1* | 11/2018 | Sugahara | G06F 17/504 |
| 2018/0348298 A1* | 12/2018 | Bhagwat | G01R 31/3177 |
| 2019/0212387 A1* | 7/2019 | Gangwal | G01R 31/31855 |

FOREIGN PATENT DOCUMENTS

| | | |
|---|---|---|
| KR | 1421909 | 7/2014 |
| KR | 1457557 | 10/2014 |
| KR | 1679375 B1 | 11/2016 |
| KR | 1681153 B1 | 12/2016 |

\* cited by examiner

| Shift out | Fault type |
|---|---|
| 001000100010 | Slow rise |
| 011101110111 | Slow fall |
| 011001100110 | Slow |
| 101110111011 | Fast rise |
| 000100010001 | Fast fall |
| 100110011001 | Fast |

SEMICONDUCTOR DEVICE

This application claims the benefit of Korean Patent Application No. 10-2018-0016936 filed on Feb. 12, 2018 in the Korean Intellectual Property Office, the disclosure of which is incorporated herein in its entirety by reference.

BACKGROUND

1. Field

The present disclosure relates to a semiconductor device.

2. Description of the Related Art

Degradation of a semiconductor circuit can cause performance degradation or a system error. Therefore, it is necessary to ascertain or measure the degree of degradation of the semiconductor circuit. However, adding a separate device such as a process, voltage and temperature (PVT) sensor to measure the degree of degradation increases the area of the product and increases the power consumed by the product.

SUMMARY

Aspects of the present disclosure provide a semiconductor device which can easily ascertain or measure the degree of degradation using a scan chain of a system-on-chip (SoC).

However, aspects of the present disclosure are not restricted to the one set forth above. The above and other aspects of the present disclosure will become more apparent to one of ordinary skill in the art to which the present disclosure pertains by referencing the detailed description of the present disclosure given below.

According to an aspect of the present disclosure, there is provided a semiconductor device including a processing block which comprises one or more intellectual property (IP) blocks; a scan chain block which is electrically connected to the one or more IP blocks, wherein the scan chain includes a scan in (SI) terminal and a scan out (SO) terminal; a pattern generating circuit which generates a data pattern having a plurality of bits and inputs the data pattern to the scan in (SI) terminal of the scan chain block; and an analyzing circuit which determines a degree of degradation of each of the one or more IP blocks based on a result pattern output from the scan out (SO) terminal of the scan chain block.

According to another aspect of the present disclosure, there is provided a semiconductor device including a processing block which comprises a first IP block and a second IP block; a scan chain block which comprises a first scan chain electrically connected to the first IP block and a second scan chain electrically connected to the second IP block; and a sensing circuit which measures the degree of degradation of the first IP block by inputting a first data pattern to the first scan chain and then analyzing a result pattern output by the first chain in response to the first data pattern and measures a degree of degradation of the second IP block by inputting a second data pattern to the second scan chain and then analyzing a result pattern output by the second chain in response to the second data pattern.

According to still another aspect of the present disclosure, there is provided a semiconductor device including a processing block which comprises one or more intellectual property (IP) blocks; a scan chain block which is electrically connected to the IP blocks, wherein the scan chain block has a scan in (SI) terminal and a scan out (SO) terminal; a pattern generating circuit which generates a first data pattern having a first frequency and a second data pattern having a second frequency different from the first frequency and provides the first data pattern and the second data pattern to the SI terminal of the scan chain block; and an analyzing circuit which determines a degree of degradation of each of the IP blocks based on a first result pattern and a second result pattern output from the SO terminal of the scan chain block.

According to yet another aspect of the present disclosure, a device comprises: a processing black which includes at least a first intellectual property (IP) block and a second IP block; at least one first scan chain electrically connected to the first IP block and at least one second scan chain electrically connected to the second IP block; at least one pattern generating circuit configured to supply a first data pattern to the first scan chain and to supply a second data pattern to the first scan chain; and at least one analyzing circuit configured to compare the first data pattern supplied to the at least one first scan chain with a first result pattern output by the at least one first scan chain and in response thereto to ascertain a degree of degradation of the first IP block, and further configured to compare the second data pattern supplied to the at least one second scan chain with a second result pattern output by the at least one second scan chain and in response thereto to ascertain a degree of degradation of the second IP block.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION

Figure 1:
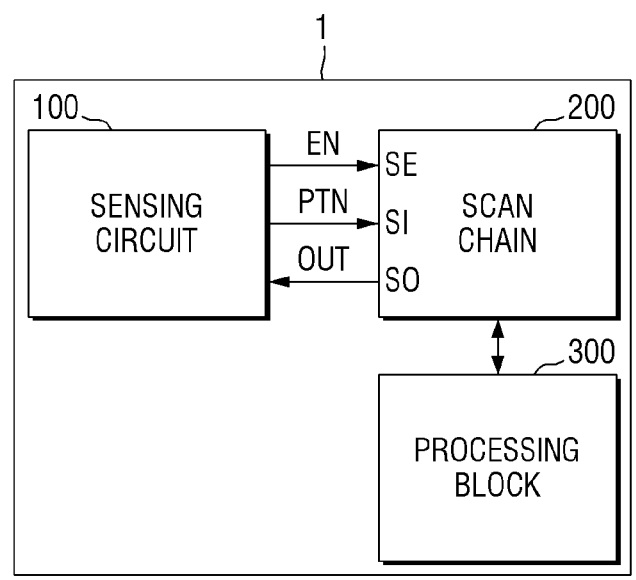
FIG. 1 is a schematic diagram of an embodiment of a semiconductor device.

FIG. 1 is a schematic diagram of an embodiment of a semiconductor device.

Referring to FIG. 1, the semiconductor device may include a system-on-chip (SoC) 1.

In the current embodiment, the SoC 1 includes a sensing circuit 100, a scan chain block 200, and a processing block 300. As discussed in greater detail below, scan chain block 200 may include one or a plurality of scan chains.

First, processing block 300 includes semiconductor circuits whose degrees of degradation are to be ascertained or measured in various embodiments. Specifically, in the current embodiment, processing block 300 includes one or more intellectual property (IP) blocks whose degrees of degradation are to be ascertained or measured, but the scope of the present disclosure is not limited thereto.

In some embodiments, each of the IP blocks may include central processing units (CPUs), graphic processing units (GPUs), or neural processing units (NPUs), but the scope of the present disclosure is not limited thereto.

Next, scan chain block 200 is a circuit included in the SoC 1 to inspect the semiconductor circuits and may be implemented by connecting sequential elements in a successive order. Scan chain block 200 forms an electrical connection with one or more IP blocks corresponding to combinational logic of a semiconductor circuit to be inspected.

Figure 6:
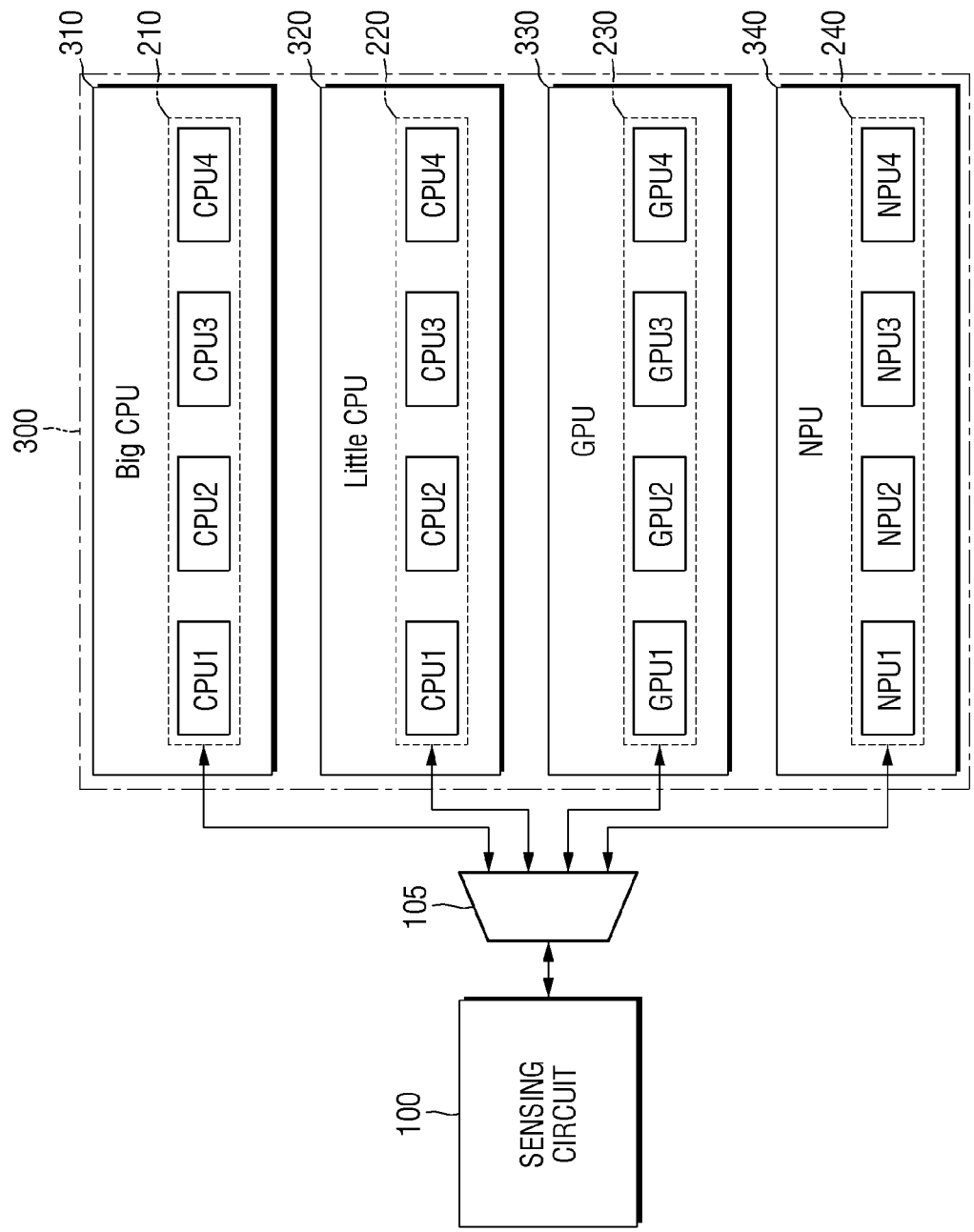
FIGS. 6 and 7 are block diagrams for explaining the operation of embodiments of semiconductor devices.
Figure 7:
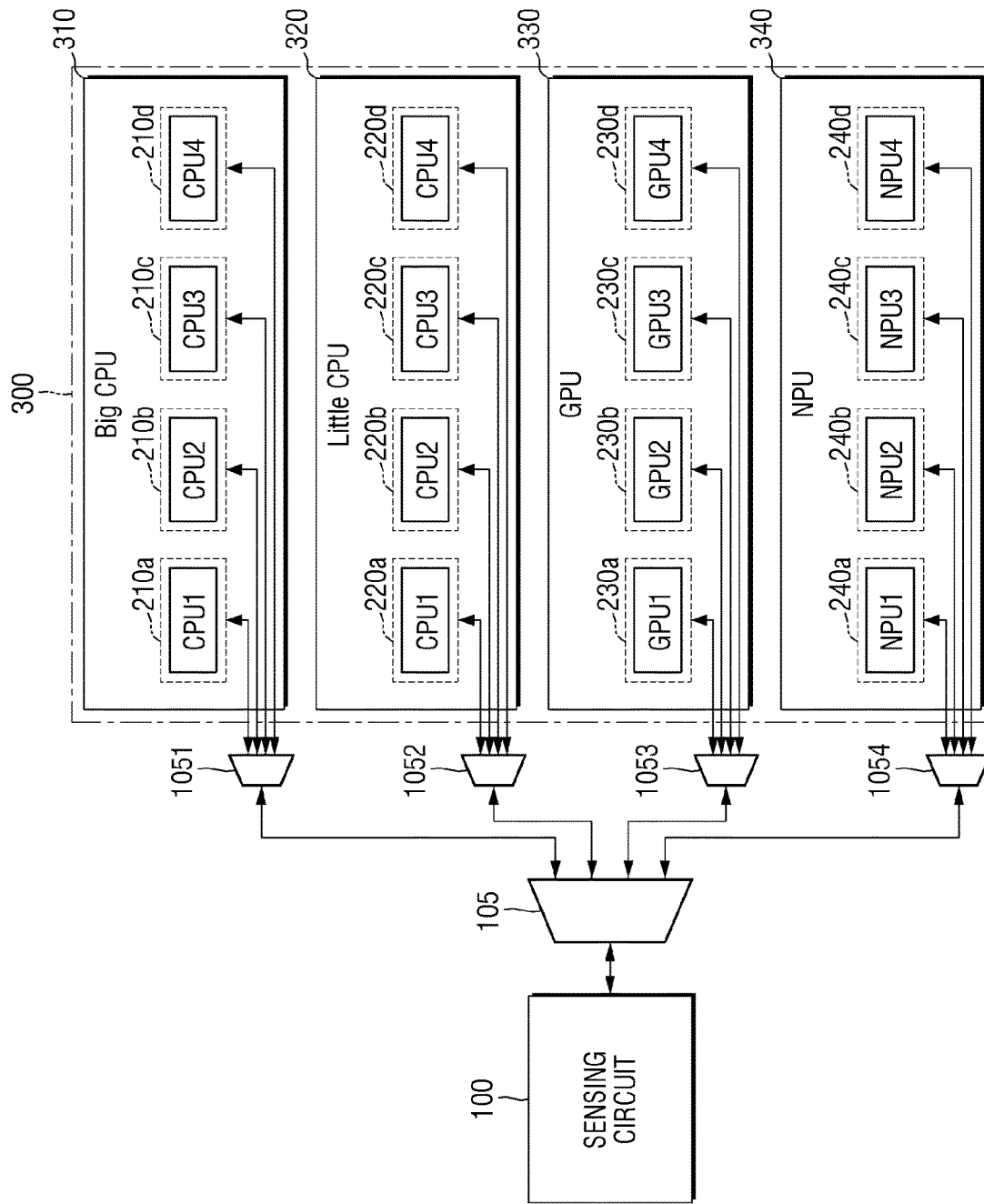

It should be noted that although scan chain block 200 is illustrated herein as a separate block from processing block 300 for ease of description, such illustration is intended for conceptual distinction between scan chain block 200 and processing block 300 and does not directly indicate the physical connection relationship between scan chain block 200 and processing block 300. For example, processing block 300 may include a first semiconductor circuit and a second semiconductor circuit different from the first semiconductor circuit, and scan chain block 200 may include a first scan chain disposed around the first semiconductor circuit and connected to the first semiconductor circuit and a second scan chain disposed around the second semiconductor circuit and connected to the second semiconductor circuit. Examples of the physical connection relationship between scan chain block 200 and processing block 300 are illustrated in FIGS. 6, 7 and 8B.

Scan chain block 200 includes a scan in (SI) terminal and a scan out (SO) terminal. The SI terminal corresponds to an input terminal of scan chain block 200, and the SO terminal corresponds to an output terminal of scan chain block 200. In addition, scan chain block 200 includes a scan enable (SE) terminal. The SE terminal may toggle the connection between a combinational circuit and a shift register.

More details of scan chain block 200 which are known in the art will not be described herein.

Sensing circuit 100 ascertains or measures the degree of degradation of an IP block included in processing block 300. Specifically, sensing circuit 100 may provide an enable signal EN to the SE terminal of scan chain block 200 to enter an operation mode for measuring the degree of degradation of an IP block included in processing block 300.

In addition, sensing circuit 100 may generate a data pattern PTN including a plurality of bits and provide the data pattern PTN to the SI terminal of scan chain block 200. After receiving a result pattern OUT output from the SO terminal of scan chain block 200 in response to the data pattern PTN, sensing circuit 100 may ascertain or determine the degree of degradation of the IP block included in processing block 300.

The semiconductor device according to the current embodiment can ascertain or measure the degree of degradation of an IP block using scan chain block 200 already provided in the SoC 1 for defect inspection without requiring a separate measuring device such as a process, voltage and temperature (PVT) sensor. Therefore, the area of the product is not additionally increased, and the power consumed by the separate measuring device can be saved.

In addition, when the degree of degradation of an IP block is measured using a separate measuring device such as a PVT sensor, the accuracy of the degradation measurement is inevitably reduced due to the physical distance between a point where the separate measuring device measures the degree of degradation and a point where the IP block is located. On the other hand, since the semiconductor device according to the current embodiment uses scan chain block 200 formed immediately adjacent to an IP block of SoC 1, errors due to the physical distance are significantly reduced. Thus, more accurate degradation measurement is possible.

Figure 2:
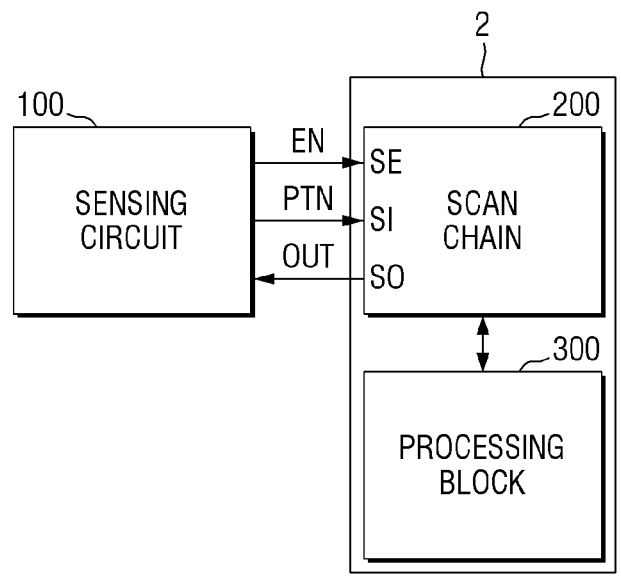
FIG. 2 is a schematic diagram of an embodiment of a semiconductor device.

FIG. 2 is a schematic diagram of an embodiment of a semiconductor device.

Referring to FIG. 2, the semiconductor device according to the embodiment may include a SoC 2 and sensing circuit 100 disposed outside the SoC 2 unlike in the embodiment of FIG. 1.

That is, sensing circuit 100 disposed outside the SoC 2 may provide an enable signal EN and a data pattern PTN respectively to an SE terminal and an SI terminal of scan chain block 200, receive a result pattern OUT through an SO terminal of scan chain block 200, and then ascertain or determine the degree of degradation of an IP block included in processing block 300.

Since the semiconductor device according to the current embodiment uses the scan chain block 200 formed immediately adjacent to an IP block of the SoC 2, errors due to the physical distance are significantly reduced unlike the case of using a separate measuring device such as a PVT sensor. Thus, more accurate degradation measurement is possible.

Sensing circuit 100 will now be described in more detail.

Figure 3:
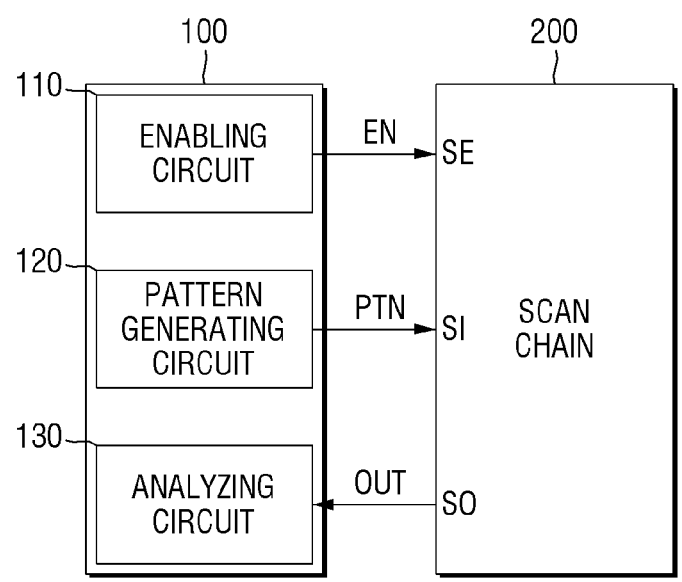
FIG. 3 is a schematic diagram of an embodiment of a semiconductor device.

FIG. 3 is a schematic diagram of an embodiment of a semiconductor device.

Referring to FIG. 3, sensing circuit 100 of the semiconductor device according to the embodiment may include an enabling circuit 110, a pattern generating circuit 120, and an analyzing circuit 130.

Enabling circuit 110 may provide an enable signal EN to an SE terminal of a scan chain block 200 so as to enter an operation mode for measuring the degree of degradation of an IP block included in a processing block 300.

For example, enabling circuit 110 may provide the enable signal EN having a first value (e.g., '0') to the SE terminal so as to enter a degradation measurement mode and may provide the enable signal EN having a second value (e.g., '1') to the SE terminal so as to terminate the degradation measurement mode.

Pattern generating circuit 120 generates a data pattern PTN including a plurality of bits and inputs the generated data pattern PTN to an SI terminal of scan chain block 200.

Analyzing circuit 130 determines the degree of degradation of one or more IP blocks based on a result pattern OUT output from an SO terminal of scan chain block 200.

Pattern generating circuit 120 and analyzing circuit 130 will be described in more detail below with reference to the corresponding drawings.

Figure 4:
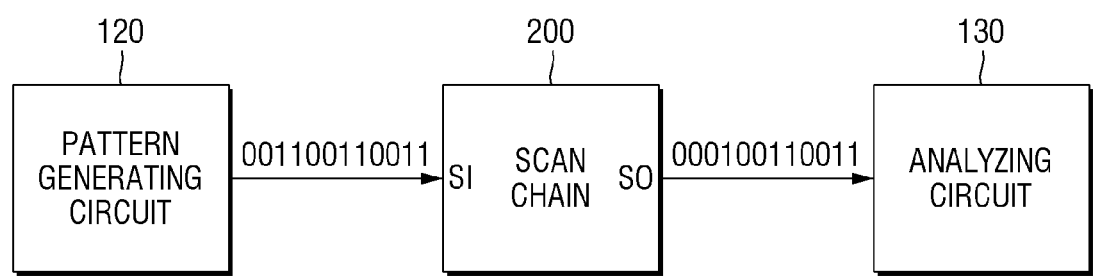
FIGS. 4, 5A and 5B are schematic diagrams for explaining the operation of an embodiment of a semiconductor device.
Figures 5A, 5B:
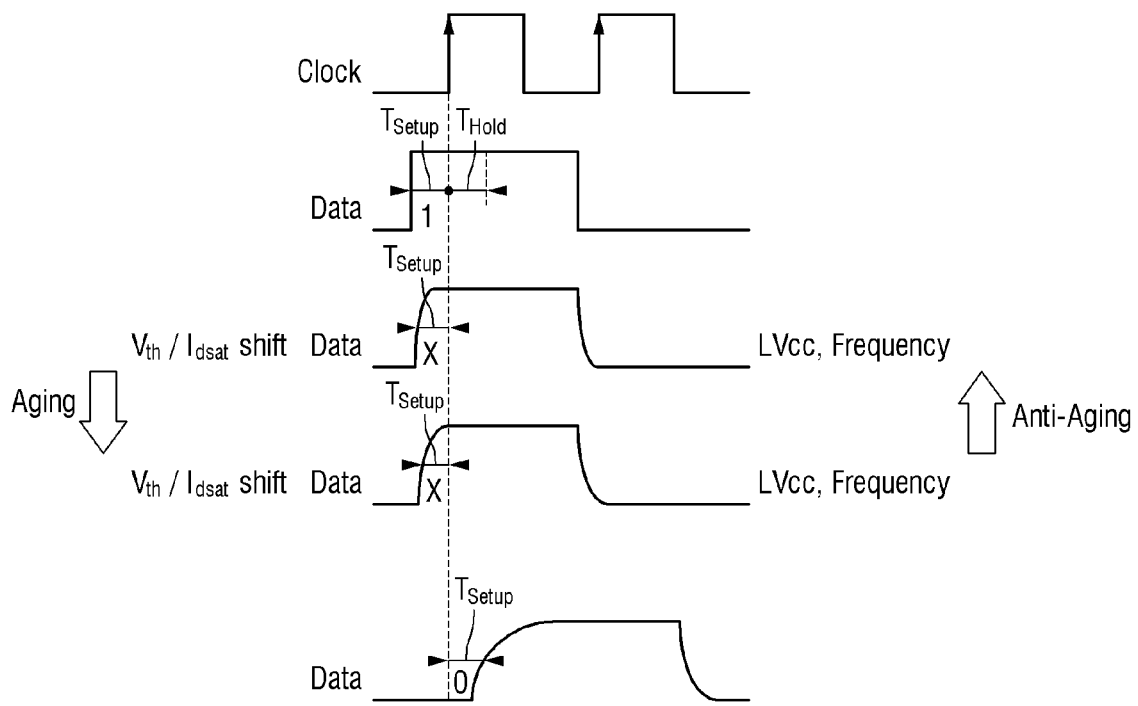

FIGS. 4, 5A and 5B are schematic diagrams for explaining the operation of an embodiment of a semiconductor device.

Referring to FIG. 4, pattern generating circuit 120 of the semiconductor device according to the embodiment may generate a data pattern PTN including a plurality of bits.

The data pattern PTN may include a bit pattern in which a first value ('0') and a second value ('1') are repeated. Referring to FIG. 4, pattern generating circuit 120 generates a data pattern PTN of "001100110011" and provides the data pattern PTN to an SI terminal of scan chain block 200. In the data pattern PTN, a bit pattern of "0011" may be repeated regularly.

The data pattern PTN is passed through sequential elements of scan circuit block 200 and then output as a result pattern OUT. Referring to FIG. 4, the result pattern OUT output from an SO terminal of scan chain block 200 is "000100110011" and is provided to an analyzing circuit 130. Analyzing circuit 130 may determine the degree of degradation of an IP block by comparing the bit pattern input to the SI terminal with the result pattern OUT output from the SO terminal.

For example, in FIG. 4, the bit pattern input to the SI terminal is repeated as "0011," while the result pattern OUT output from the SO terminal is "000100110011." Here, the underlined pattern does not match the bit pattern input to the SI terminal. In this case, analyzing circuit 130 may determine that the IP block has been degraded.

If an IP block is degraded, errors may occur in the propagation of data signals processed and transmitted by semiconductor circuits operating according to a clock signal that drives the IP block.

For example, in order to accurately read a transitioning data signal, a sufficient setup time $T_{SETUP}$ and hold time $T_{HOLD}$ must be secured before or after a rising edge or a falling edge of the clock signal. Otherwise, the data signal cannot be read accurately.

Therefore, a semiconductor device according to various embodiments may input a data pattern PTN for detecting an out-of-timing error to the SI terminal of the scan chain block 200 and ascertain or measure the degree of degradation of the IP block by determining whether a result pattern OUT is identical to the data pattern PTN.

For example, referring to FIG. 5A, it is assumed that the pattern generating circuit 120 generates a data pattern PTN in which a bit pattern of "0011" is repeated and inputs the data pattern PTN to the SI terminal of scan chain block 200. At this time, if a result pattern OUT output from the SO terminal is "001000100010," it may be determined that a slow rise fault characterized by a long rising time has occurred.

Alternatively, if the result pattern OUT output from the SO terminal is "011101110111," it may be determined that a slow fall fault characterized by a long falling time has occurred.

Alternatively, if the result pattern OUT output from the SO terminal is "011001100110," it may be determined that a slow fault characterized by a slow data signal phase for the transition of the clock signal has occurred.

In addition, if the result pattern OUT output from the SO terminal is "101110111011." it may be determined that a fast rise fault characterized by a fast rising time has occurred.

Alternatively, if the result pattern OUT output from the SO terminal is "000100010001," it may be determined that a fast fall fault characterized by a fast falling time has occurred.

Alternatively, if the result pattern OUT output from the SO terminal is "100110011001," it may be determined that a fast fault characterized by a fast data signal phase for the transition of the clock signal has occurred.

As described above, after a data pattern PTN is input to scan chain block 200, the degree of degradation of an IP block may be ascertained or measured according to various types of faults which can be determined by analyzing circuit 130 based on a result pattern OUT.

FIG. 5B illustrates an example in which the timing and the transition shape of a data signal read according to a clock signal are changed as aging, i.e., degradation of an IP block progresses over time.

Referring to FIG. 5B, before aging of an IP block progresses, a data signal has a sufficient setup time $T_{SETUP}$ and hold time $T_{HOLD}$ before and after a rising edge of a clock signal, and a rising time and a falling time of the transition of the data signal are very short. In this case, the value of the data signal read according to the clock signal is '1.'

However, as the aging progresses, that is, toward the bottom of FIG. 5B, the setup time $T_{SETUP}$ that should be secured before the rising edge of the clock signal is gradually reduced, and the rising time and the falling time of the transition of the data signal become longer. In this case, the value of the data signal read according to the clock signal is an unstable value of 'X' which may be determined as either '1' or '0.'

As the aging progresses further, that is, referring to the bottom of FIG. 5B, the transition of the data signal itself is out of the rising edge of the clock signal, and the rising time and the falling time of the transition of the data signal become even longer. In this case, the value of the data signal read according to the clock signal is '0,' which is a wrong value.

In this case, anti-aging may be performed using a frequency control circuit 140 and a voltage control circuit 150, according to an embodiment which will be described in detail later with reference to FIGS. 8A and 8B. Accordingly, a sufficient setup time $T_{SETUP}$ and hold time $T_{HOLD}$ can be secured again before and after the rising edge of the clock signal, and the rising time and the falling time of the transition of the data signal can be sufficiently reduced. Thus, the data signal can be successfully read according to the clock signal.

FIGS. 6 and 7 are block diagrams for explaining the operation of embodiments of semiconductor devices.

Referring to FIG. 6, processing block 300 may include an IP block 310 including a plurality of big CPU IP blocks, an IP block 320 including a plurality of little CPU IP blocks, an IP block 330 including a plurality of GPU IP blocks, and an IP block 340 including a plurality of NPU IP blocks.

In addition, scan chain block 200 may include a first scan chain 210 electrically connected to IP block 310, a second scan chain 220 electrically connected to IP block 320, a third scan chain 230 electrically connected to IP block 330, and a fourth scan chain 240 electrically connected to IP block 340.

In the current embodiment, sensing circuit 100 may input a data pattern PTN to each of first through fourth scan chains 210 through 240 using a mux/demux circuit 105 and receive a result pattern from each of first through fourth scan chains 210 through 240. In this way, sensing circuit 100 may ascertain or measure the degree of degradation of each of IP blocks 310 through 340 corresponding to first through fourth scan chains 210 through 240, respectively.

According to the current embodiment, it is possible to ascertain or measure the degree of degradation of only a desired IP block among one or more IP blocks included in processing block 300.

Referring to FIG. 7, unlike in FIG. 6, an IP block 310 may include a plurality of first scan chains 210a through 210d respectively corresponding to a plurality of big CPU IP blocks, and an IP block 320 may include a plurality of second scan chains 220a through 220d respectively corresponding to a plurality of small CPU IP blocks. Similarly, an IP block 330 may include a plurality of third scan chains 230a through 230d respectively corresponding to a plurality of GPU IP blocks, and an IP block 340 may include a plurality of fourth scan chains 240a through 240d respectively corresponding to a plurality of NPU IP blocks.

In the current embodiment, a sensing circuit 100 may input a data pattern PTN to each of first scan chains 210a through 210d, second scan chains 220a through 220d, third scan chains 230a through 230d, and fourth scan chains 240a through 240d using mux/demux circuits 105, 1051, 1052, 1053 and 1054 and receive a result pattern from each of first scan chains scan chains 210a through 210d, second scan chains 220a through 220d, third scan chains 230a through 230d, and fourth scan chains 240a through 240d. In this way, sensing circuit 100 may ascertain or measure the degree of degradation of an IP block corresponding to each of second scan chains scan chains 210a through 210d, second scan chains 220a through 220d, second scan chains 230a through 230d, and 240a through 240d.

According to the current embodiment, it is possible to more finely measure the degree of degradation of only a desired IP block among one or more IP blocks included in processing block 300.

Figure 8A:
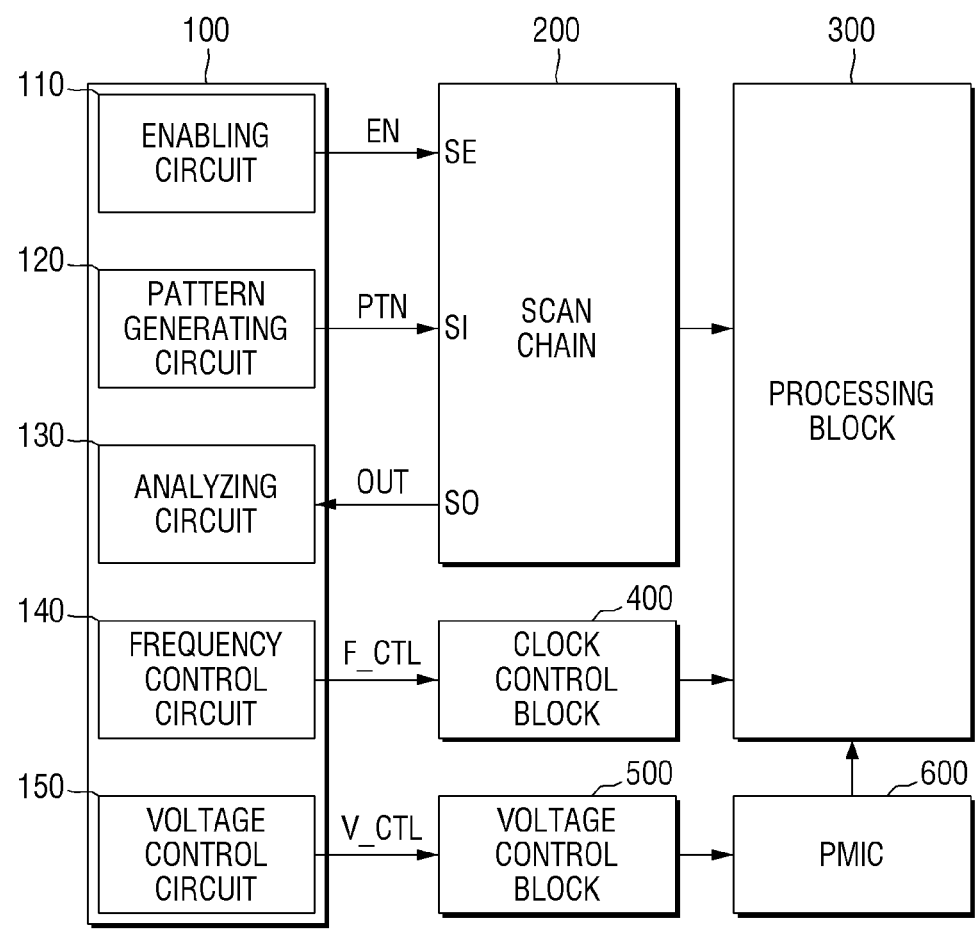
FIGS. 8A and 8B are schematic diagrams of an embodiment of a semiconductor device.
Figure 8B:
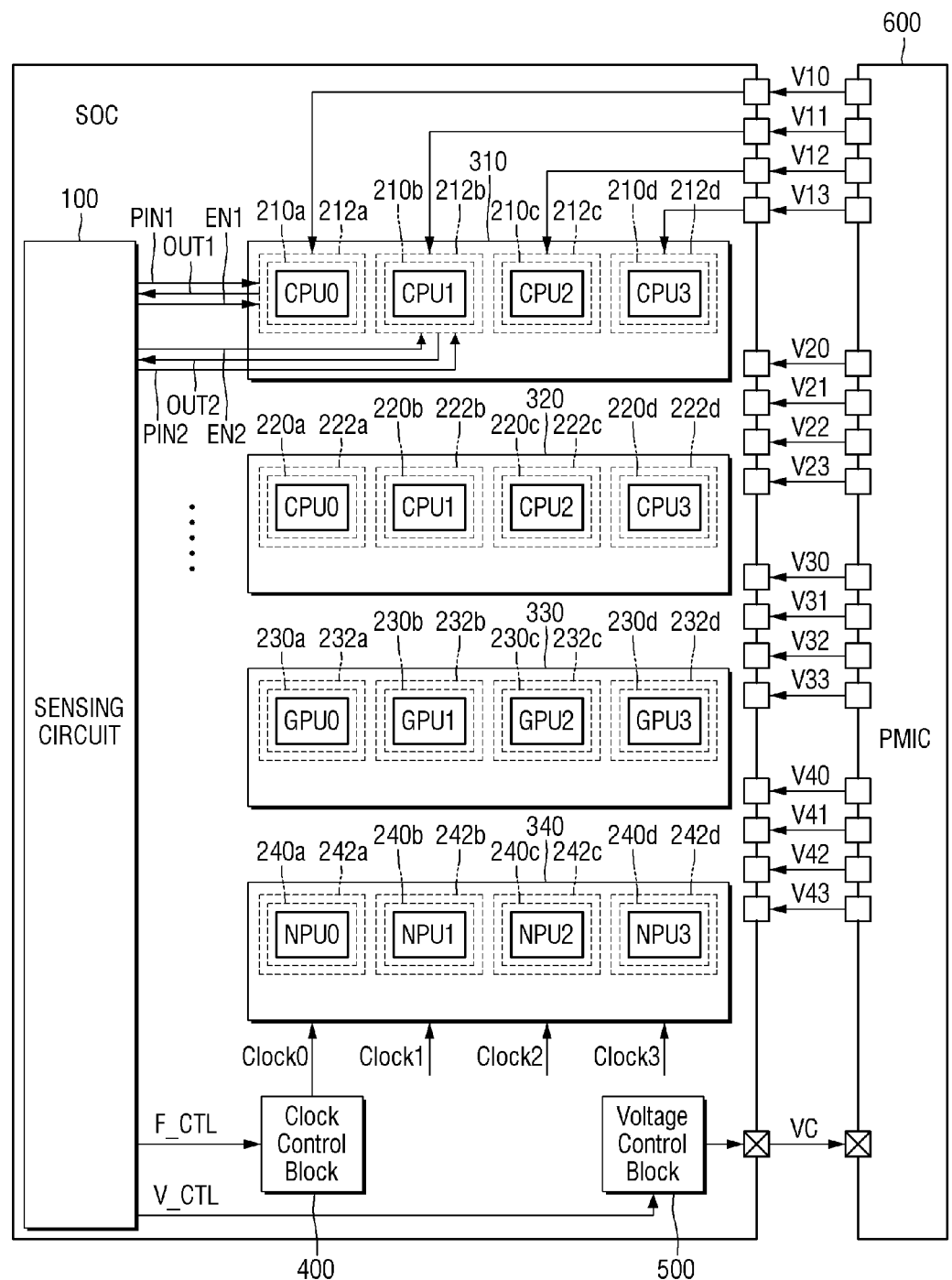

FIGS. 8A and 8B are schematic diagrams of an embodiment of a semiconductor device.

As mentioned above in relation to FIG. 1, scan chain block 200 is illustrated herein as a separate block from processing block 300 for ease of description. However, such illustration is intended for conceptual distinction between scan chain block 200 and processing block 300 and does not directly indicate the physical connection relationship between scan chain block 200 and processing block 300. For example, processing block 300 may include a first semiconductor circuit and a second semiconductor circuit different from the first semiconductor circuit, and scan chain block 200 may include a first scan chain disposed around the first semiconductor circuit and connected to the first semiconductor circuit and a second scan chain disposed around the second semiconductor circuit and connected to the second semiconductor circuit.

Referring to FIG. 8A, sensing circuit 100 of the semiconductor device according to the embodiment may further include at least one of frequency control circuit 140 and voltage control circuit 150.

Frequency control circuit 140 adjusts the frequency of a clock signal provided to one or more IP blocks based on the degree of degradation determined using pattern generating circuit 120 and analyzing circuit 130, for example as discussed above.

Specifically, referring also to FIG. 7, when determining that the frequency of a clock signal for driving GPU1 should be increased or decreased as a result of analyzing a result pattern OUT output in response to a data pattern PTN input to scan chain 230a, frequency control circuit 140 generates a frequency control signal F_CTL.

The frequency control signal F_CTL is transmitted to a clock control block 400 which controls frequencies of driving clocks of elements inside a SoC, and clock control block 400 increases or decreases the frequency of the driving clock signal of GPU1 according to the frequency control signal F_CTL.

In this way, the frequency of a clock signal for driving each internal element of the SoC may be adjusted according to the finely measured degree of degradation of the element, thereby extending the life of the SoC.

voltage control circuit 150 adjusts a driving voltage provided to each of the IP blocks based on the degree of degradation determined using pattern generating circuit 120 and analyzing circuit 130, for example as discussed above.

Specifically, referring also to FIG. 7, when determining that a voltage for driving NPU2 should be increased or decreased as a result of analyzing a result pattern OUT output in response to a data pattern PTN input to scan chain 240b, voltage control circuit 150 generates a voltage control signal V_CTL.

The voltage control signal V_CTL is transmitted to a voltage control block 500 which controls driving voltages of the elements inside the SoC, and voltage control block 500 provides a request to increase or decrease the driving voltage of NPU2 according to the frequency control signal F_CTL to a power management integrated circuit (PMIC) 600. PMIC 600 adjusts the driving voltage of NPU2 in response to the request.

In this way, a driving voltage of each internal element of the SoC may be adjusted according to the finely measured degree of degradation of the element, thereby extending the life of the SoC.

Referring to FIG. 8B, an embodiment in which sensing circuit 100 and IP blocks 310 through 340 of FIG. 7 are implemented as a SoC is illustrated.

Specifically, IP block 310 may include the plurality of scan chains 210a through 210d respectively corresponding to a plurality of big CPU IP blocks, and IP block 320 may include the plurality of scan chains 220a through 220d respectively corresponding to a plurality of little CPU IP blocks. Similarly, IP block 330 may include the plurality of scan chains 230a through 230d respectively corresponding to a plurality of GPU IP blocks, and IP block 340 may include the plurality of scan chains 240a through 240d respectively corresponding to a plurality of NPU IP blocks.

In addition, IP block 310 may include a plurality of voltage chains 212a through 212d respectively corresponding to the big CPU IP blocks, and IP block 320 may include a plurality of voltage chains 222a through 222d respectively corresponding to the little CPU IP blocks. Similarly, IP block 330 may include a plurality of voltage chains 232a through 232d respectively corresponding to the GPU IP blocks, and IP block 340 may include a plurality of voltage chains 242a through 242d respectively corresponding to the NPU IP blocks.

Sensing circuit 100 may ascertain or measure the degree of degradation of, e.g., big CPU0 of IP block 310 by exchanging an enable signal EN1, a data pattern PTN1 and a result pattern OUT1 with scan chain 210a connected to big CPU0 of IP block 310.

Then, frequency control circuit 140 of sensing circuit 100 may, if necessary, increase or decrease the frequency of a clock signal provided to big CPU0 through clock control block 400 according to the ascertained or measured degree of degradation. For this operation, clock control block 400 may control a clock signal (Clock 0 through Clock 3) for each element of an IP block.

In addition, voltage control circuit 150 of sensing circuit 100 may, if necessary, increase or decrease a supply voltage provided to voltage chain 212a of big CPU0 through voltage control block 500 and PMIC 600 according to the ascertained or measured degree of degradation. To support this operation, each of the SoC and PMIC 600 may include a plurality of terminals that can provide a supply voltage for each element, and PMIC 600 may provide supply voltages V10 through V13, V20 through V23, V30 through V33 and V40 through V43 to the SoC through the terminals.

Separately from the above operations, sensing circuit 100 may ascertain or measure the degree of degradation of big CPU1 of IP block 310 by exchanging an enable signal EN2, a data pattern PTN2 and a result pattern OUT2 with scan chain 210b connected to big CPU1 of IP block 310.

Then, frequency control circuit 140 of sensing circuit 100 may, if necessary, increase or decrease the frequency of a clock signal provided to big CPU1 of IP block 310 through clock control block 400 according to the measured degree of degradation.

In addition, voltage control circuit 150 of sensing circuit 100 may, if necessary, increase or decrease a supply voltage provided to voltage chain 212b of big CPU1 of IP block 310 through voltage control block 500 and PMIC 600 according to the measured degree of degradation.

As described above, according to various embodiments, sensing circuit 100 may ascertain or measure the degree of degradation of each of big CPU0 through big CPU3, little CPU0 through little CPU3, GPU0 through GPU3, and NPU0 through NPU3 and then individually adjust the frequency of an operating clock and/or a driving voltage based on the measured degree of degradation.

Further, according to various embodiments, when, e.g., big CPU 1 is too aged to operate, for example, big CPU2 or big CPU3 may be driven instead of big CPU1 based on the operation of sensing circuit 100. Such efficient management of hardware resources can ultimately extend the life of the SoC.

Figure 8C:
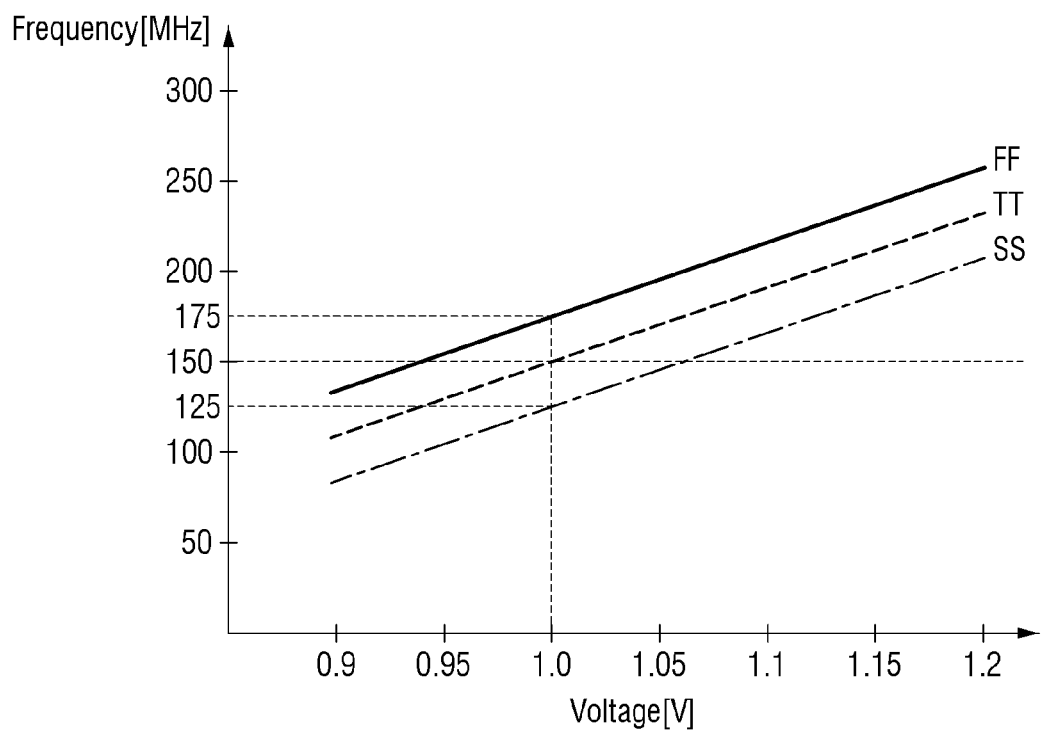
FIGS. 8C, 8D and 8E illustrate examples of beneficial effects generated according to various embodiments.
Figure 8D:
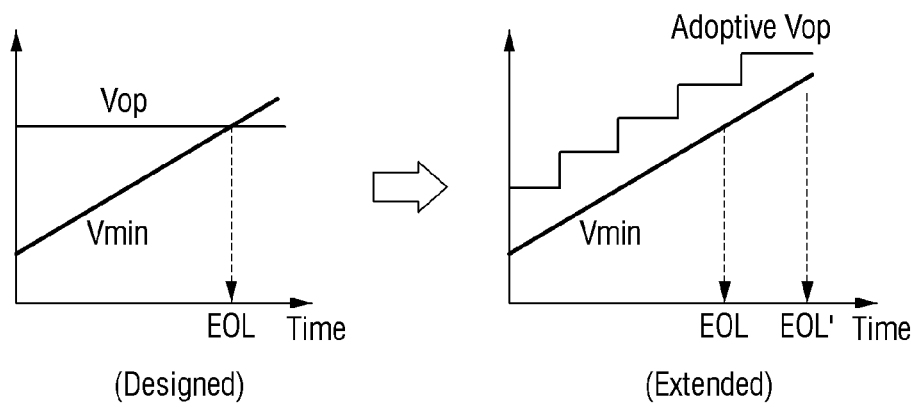
Figure 8E:
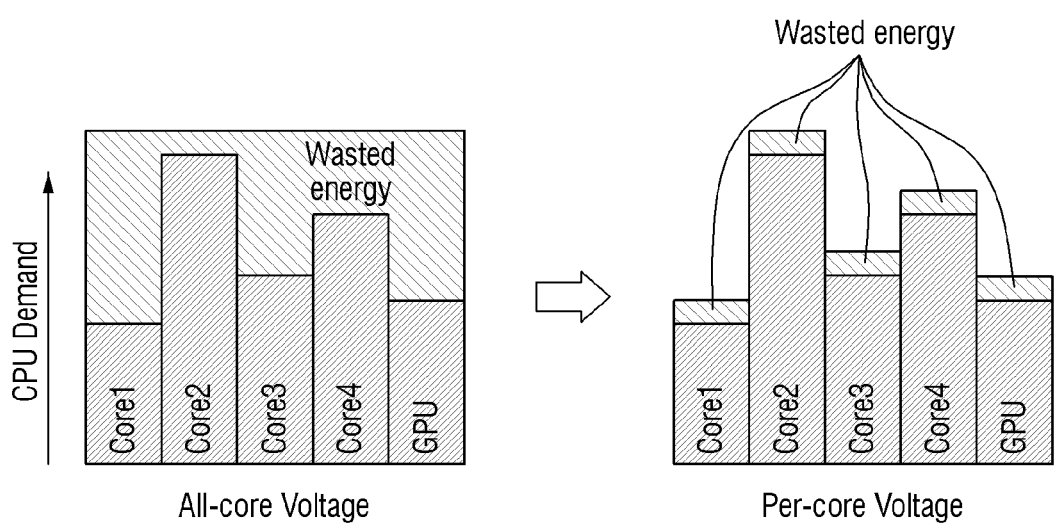

FIGS. 8C through 8E illustrate examples of beneficial effects generated according to various embodiments.

Referring first to FIGS. 8C and 8D, according to various embodiments it is possible to reduce the power consumption of a SoC and extend an end of life (EOL) of the SoC by adjusting a voltage according to the situation using a scan chain for each element (e.g., each big CPU, each little CPU, each GPU, each NPU, etc.) in the SoC.

Referring to FIG. 8C, a chip (e.g., a SoC) may have an FF corner, a TT corner, or an SS corner according to a process margin. In other words, chips produced may have the FF corner, the TT corner, and the SS corner as their dispersion.

Assuming that a target frequency of a CPU is 150 MHz, the target frequency of 150 MHz can be achieved by supplying a voltage of 1.0 V to a chip corresponding to the TI corner.

However, if the voltage of 1.0 V is supplied to a chip corresponding to the FF corner, an operating frequency of 175 MHz is generated, resulting in a waste of the supply voltage. That is, the target frequency of 150 MHz can be achieved by supplying only a voltage of, e.g., 0.95 V to the chip corresponding to the FF corner.

If the voltage of 1.0 V is supplied to a chip corresponding to the SS corner, an operating frequency of 125 MHz is generated. Thus, the target frequency of 150 MHz cannot be achieved. In this case, the voltage supplied needs to be increased to, e.g., 1.05 V.

Referring to FIG. 8D, as aging progresses over time, a minimum voltage Vmin that is required to guarantee a minimum operation level increases. In consideration of this fact, an operating voltage Vop is set to an invariable value in view of, e.g., a PVT margin in the conventional art. In this case, when the voltage Vmin reaches the operating voltage Vop, it is determined that a corresponding chip has reached the EOL.

On the other hand, according to various embodiments of devices disclosed herein, an adaptive hop method is employed. In the adaptive hop method, the degree of degradation is ascertained or measured when necessary using a scan chain while a chip is being used, and a supply voltage for compensating for the measured degree of degradation is adjusted. Thus, since the adaptive hop method can extend EOL to EOL', the life of a chip (e.g., a SoC) can be extended. Furthermore, according to the adaptive hop method, there is no need to set a sufficiently large margin when setting an initial voltage Vop before aging progresses. Consequently, the power consumption of the chip (e.g., the SoC) can be reduced.

Referring to FIG. 8E, a scan chain is connected to all elements such as a first core, a second core, a third core, a fourth core, and a GPU. When this scan chain is used to ascertain or measure the degree of degradation, it is difficult to finely measure the degree of degradation of each element.

Accordingly, wasted energy is generated as illustrated on the left side of FIG. 8E in order to secure a margin for a supply voltage or an operating frequency in consideration of all of the above elements.

On the other hand, according to various embodiments disclosed herein, scan chains are respectively connected to elements such as a first core, a second core, a third core, a fourth core, and a GPU. Therefore, the degree of degradation of each element can be finely measured using a corresponding scan chain, and a margin for a supply voltage or an operating frequency can also be finely set for each element. This can reduce wasted energy, as illustrated on the right side of FIG. 8E.

Figure 9:
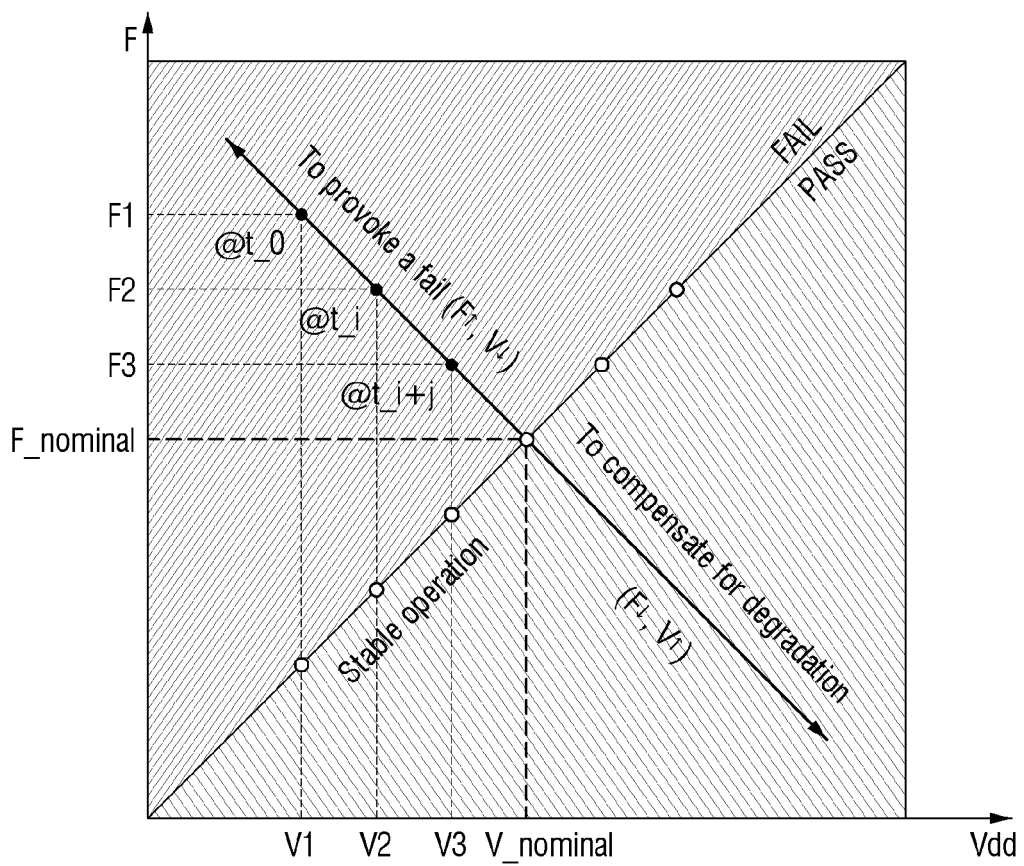
FIG. 9 is a diagram for explaining an embodiment of a semiconductor device.

FIG. 9 is a diagram for explaining an embodiment of a semiconductor device.

Referring to FIG. 9, a graph is illustrated showing a driving voltage Vdd and a frequency F of an IP block whose degree of degradation is to be determined.

In some embodiments, an overclock frequency corresponding to a FAIL area may be used for the IP block. Specifically, a data pattern PTN having an overclock frequency F1 for provoking a fail may be input to scan chain block 200 at a time t_0. Then, a result pattern OUT output from scan chain block 200 in response to the data pattern PTN may be determined as reference data.

Next, a data pattern PTN having an overclock frequency F2 may be input to scan chain block 200 at a time t_i, and then a data pattern PTN having an overclock frequency F3 may be input to scan chain block 200 at a time t_i+j. In this way, the degree of degradation of the IP block may be ascertain or measured.

That is, pattern generating circuit 120 may input a data pattern PTN having an overclock frequency for provoking a fail of an IP block to an SI terminal, and analyzing circuit 130 may ascertain or measure the degree of degradation of the IP block based on a result pattern output from an SO terminal.

Figure 10:
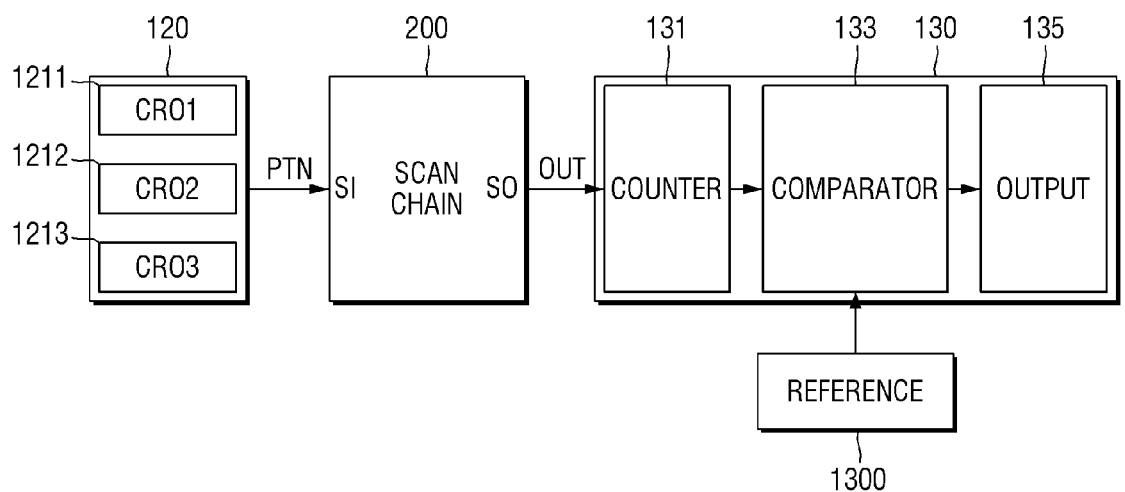
FIG. 10 is a schematic diagram of an embodiment of a semiconductor device.

FIG. 10 is a schematic diagram of an embodiment of a semiconductor device.

Referring to FIG. 10, pattern generating circuit 120 may include a plurality of configurable ring oscillators 1211 through 1213.

Pattern generating circuit 120 may generate a first data pattern PTN1 having a first frequency and a second data pattern PTN2 having a second frequency different from the first frequency using configurable ring oscillators 1211 through 1213, and input the first data pattern PTN1 and the second data pattern PTN2 to an SI terminal.

Analyzing circuit 130 may ascertain or measure the degree of degradation of an IP block based on a first result pattern OUT1 output from an SO terminal in response to the first data pattern PTN1 having the first frequency and a second result pattern OUT2 output from the SO terminal in response to the second data pattern PTN2 having the second frequency.

Specifically, analyzing circuit 130 may include a counter 131, a comparator 133, and an output unit 135.

Counter 131 counts the number of transitions of a clock signal of a result pattern OUT output from the SO terminal, and comparator 133 compares the counted number of transitions with reference data 1300 obtained at the time t_0 as described above with reference to FIG. 9. Then, output unit 150 determines the degree of degradation of an IP block according to the comparison result of comparator 133.

That is, analyzing circuit 130 can ascertain or measure the degree of degradation of an IP block by comparing a result pattern obtained from the SO terminal at a first time with a result pattern obtained from the SO terminal at a second time different from the first time.

Figure 11:
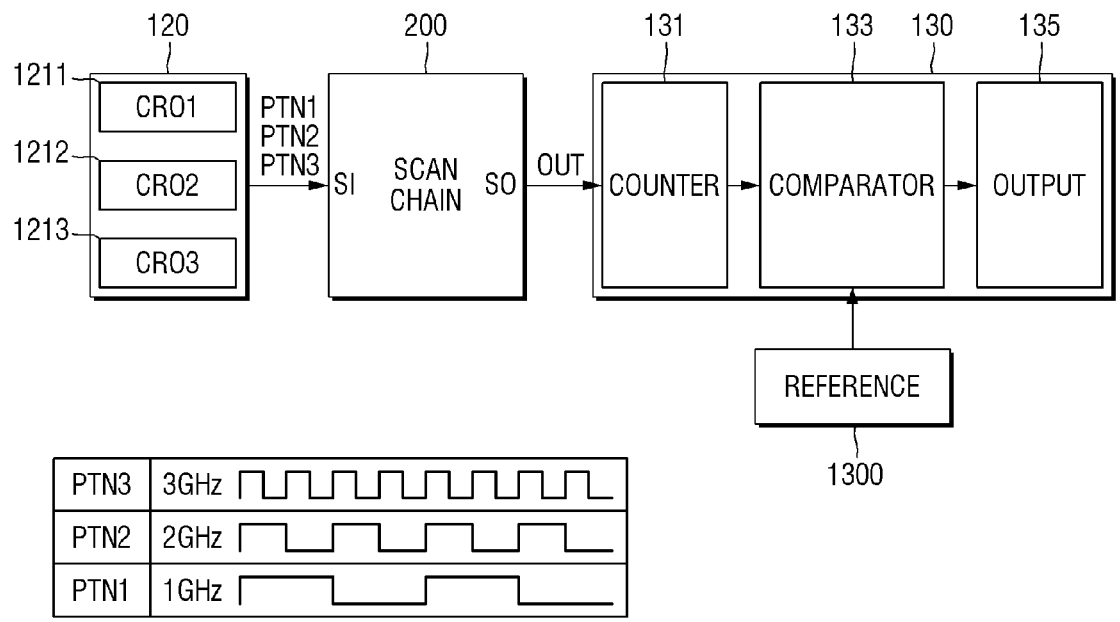
FIGS. 11, 12 and 13 are schematic diagrams for explaining the operation of the semiconductor device according to the embodiment of FIG. 10.
Figures 12, 13:
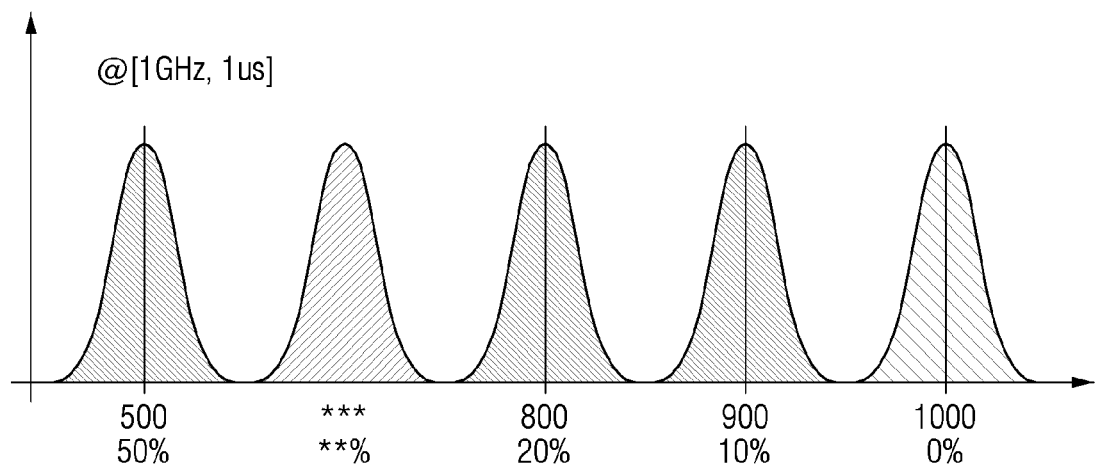

FIGS. 11 through 13 are schematic diagrams for explaining the operation of the semiconductor device according to the embodiment of FIG. 10.

Referring to FIG. 11, pattern generating circuit 120 may generate a first data pattern PTN1 having a frequency of 1 GHz, a second data pattern PTN2 having a frequency of 2 GHz, and a third data pattern PTN3 having a frequency of 3 GHz using configurable ring oscillator 1211 and input the first data pattern PTN1, the second data pattern PTN2 and the third data pattern PTN3 to the SI terminal.

Analyzing circuit 130 may ascertain or measure the degree of degradation of an IP block based on a first result pattern OUT1 output from the SO terminal in response to the first data pattern PTN1 having the frequency of 1 GHz, a second result pattern OUT2 output from the SO terminal in response to the second data pattern PTN2 having the frequency of 2 GHz and a third result pattern OUT3 output from the SO terminal in response to the third data pattern PTN3 having the frequency of 3 GHz.

Specifically, referring also to FIGS. 12 and 13, analyzing circuit 130 counts the number of transitions of a clock signal of each of the first through third result patterns OUT1 through OUT3 using counter 131.

For example, the number of transitions of the clock signal of the first result pattern OUT1 may be counted as 999, 2000, and 2998 for 1 μs, 2 μs, and 3 μs, respectively. In addition, the number of transitions of the clock signal of the second result pattern OUT2 may be counted as 2001, 3999, and 6012 for 1 μs, 2 μs, and 3 μs, respectively, and the number of transitions of the clock signal of the third result pattern OUT3 may be counted as 2997, 6017, and 8991 for 1 μs, 2 μs, and 3 μs, respectively.

Here, comparator 133 of analyzing circuit 130 may compare a cell V11 with a cell V33. That is, a value obtained by multiplying the value of the cell V11 by 3 may be compared with the value of the cell V33 to determine the degree of degradation. In addition, the comparator 133 may compare a cell V12 with a cell V21. In addition, comparator 133 may compare a cell V13 with a cell V31 to determine the degree of degradation.

For example, referring to FIG. 13, the number of transitions of the clock signal of the first result pattern OUT1 should ideally be counted as 1000 for 1 μs, but the actual counted number of transitions decreases according to the degree of degradation may be less than 1000—in this case 999. Specifically, if the number of transitions of the clock signal of the first result pattern OUT1 is counted as 900 for 1 μs, the degree of degradation of a corresponding IP block may be determined to be 10%; if the number of transitions is counted as 800, the degree of degradation of the corresponding IP block may be determined to be 20%; etc.

Here, the ideal value may be defined as a value arithmetically calculated using a frequency or may be defined as the reference data described above.

In this way, the degree of degradation of an IP block can be ascertained or measured by counting the number of transitions of the clock signal of each of the first through third result patterns OUT1 through OUT3 using counter 131.

Various modifications of the semiconductor device operating in the way described above with reference to FIGS. 9 through 13 will now be described.

Figure 14:
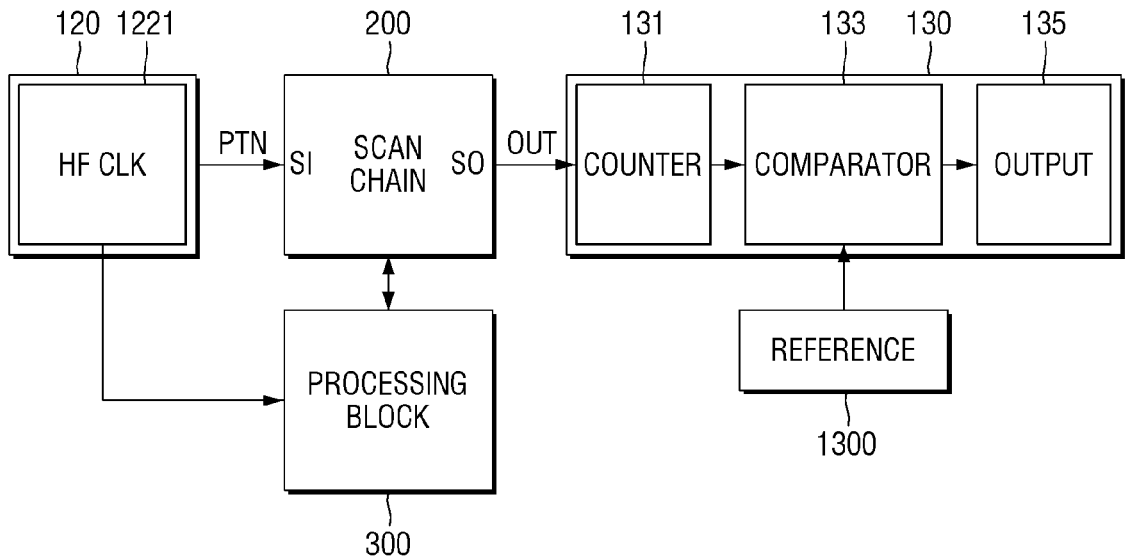
FIG. 14 is a schematic diagram of an embodiment of a semiconductor device.

FIG. 14 is a schematic diagram of an embodiment of a semiconductor device.

Referring to FIG. 14, the semiconductor device according to the current embodiment is different from the semiconductor device according to the embodiment of FIG. 10 is that pattern generating circuit 120 includes a high frequency clock generator 1221. However, high frequency clock generator 1221 can also be disposed outside the pattern generating circuit 120 but inside sensing circuit 100.

Pattern generating circuit 120 may generate a data pattern PTN using a clock signal output from high frequency clock generator 1221 and provide the clock signal output from high frequency clock generator 1221 to processing block 300.

That is, pattern generating circuit 120 may transmit the clock signal output from high frequency clock generator 1221 to scan chain block 200 and processing block 300 using various paths.

Then, analyzing circuit 130 may ascertain or measure the degree of degradation of an IP block by counting the number of transitions in a result pattern OUT output from an SO terminal in response to the data pattern PTN generated using the clock signal output from high frequency clock generator 1221.

Figure 15:
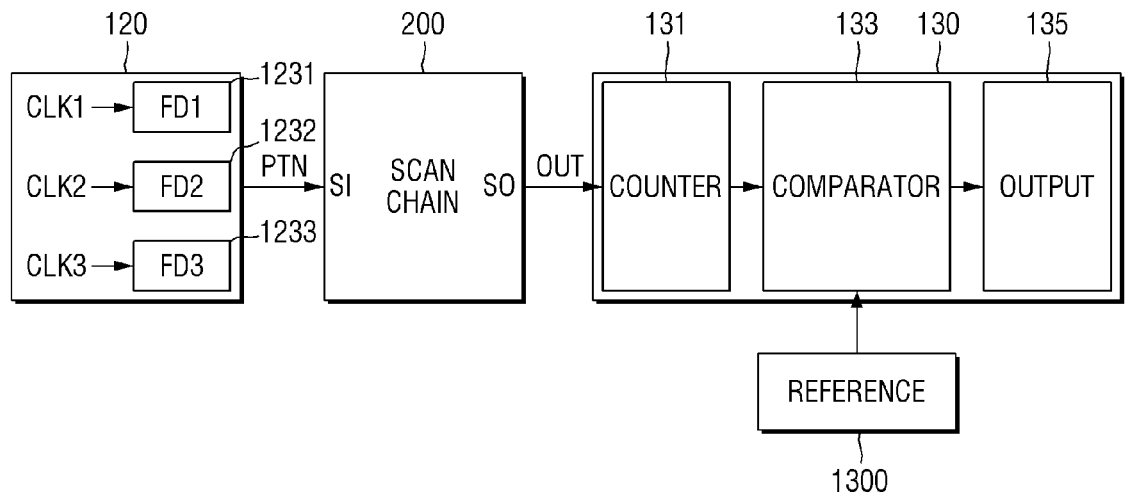
FIG. 15 is a schematic diagram of an embodiment of a semiconductor device.

FIG. 15 is a schematic diagram of an embodiment of a semiconductor device.

Referring to FIG. 15, the semiconductor device according to the current embodiment is different from the semiconductor device according to the embodiment of FIG. 10 in that pattern generating circuit 120 includes a plurality of divider circuits FD1 through FD3.

The divider circuit FD1 divides an oscillation signal CLK1 according to a first division ratio and generates a data pattern PTN based on the divided oscillation signal CLK1. Similarly, the divider circuits FD2 and FD3 respectively divide oscillation signals CLK2 and CLK3 according to a second division ratio and a third division ratio and generate data patterns PTN based on the divided oscillation signals CLK2 and CLK3.

Then, analyzing circuit 130 may ascertain or measure the degree of degradation of an IP block by counting the number of transitions in result patterns OUT output from an SO terminal in response to each of the data patterns PTN generated by the divider circuits FD1 through FD3.

Figure 16:
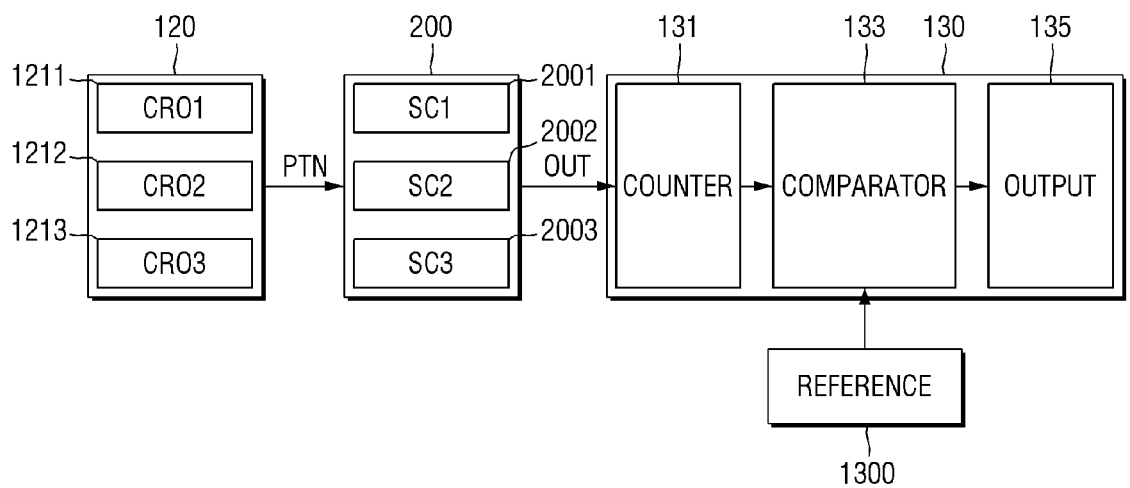
FIG. 16 is a schematic diagram of an embodiment of a semiconductor device.

FIG. 16 is a schematic diagram of an embodiment of a semiconductor device.

Referring to FIG. 16, the semiconductor device according to the current embodiment is different from the semiconductor device according to the embodiment of FIG. 10 in that scan chain block 200 includes a plurality of scan chains 2001 through 2003. Scan chains 2001 through 2003 may correspond to the first through fourth scan chains 210 through 240 described above with reference to FIG. 6 or scan chains 210a through 210d, 220a through 220d, 230a through 230d, and 240a through 240d described above with reference to FIG. 7.

Analyzing circuit 130 may ascertain or measure the degree of degradation of an IP block by counting the number of transitions in a result pattern OUT output from an SO terminal in response to a data pattern PTN input to each of scan chains 2001 through 2003.

According to the current embodiment, it is possible to ascertain or measure the degree of degradation of only a desired IP block among one or more IP blocks included in processing block 300.

Figure 17:
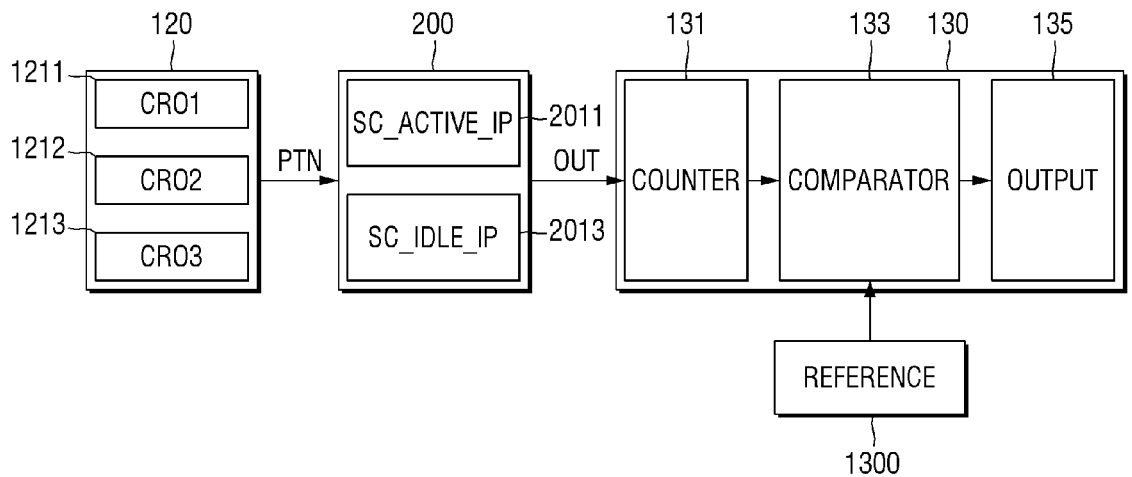
FIG. 17 is a schematic diagram of an embodiment of a semiconductor device.

FIG. 17 is a schematic diagram of an embodiment of a semiconductor device.

Referring to FIG. 17, the semiconductor device according to the current embodiment is different from the semiconductor device according to the embodiment of FIG. 10 is that one or more IP blocks include an active IP block and an idle IP block.

In this case, scan chain block 200 includes a scan chain 2011 electrically connected to the active IP block and a scan chain 2013 electrically connected to the idle IP block.

In the current embodiment, sensing circuit 100 may ascertain or measure the degree of degradation of the idle IP block by inputting a data pattern PTN only to the scan chain 2013 electrically connected to the idle IP block and may keep the active IP block continuously processing other tasks.

That is, while the active IP block is processing other tasks, analyzing circuit 130 may ascertain or measure the degree of degradation of the idle IP block by counting the number of transitions in a result pattern OUT output from an SO terminal in response to the data pattern PTN input to scan chain 2013 electrically connected to the idle IP block.

Figure 18:
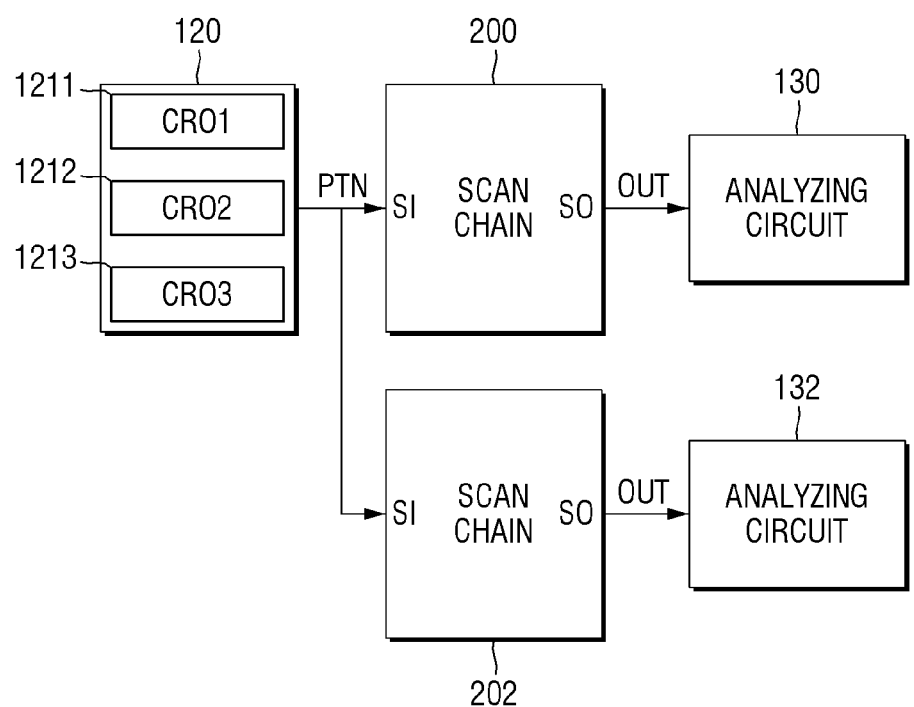
FIG. 18 is a schematic diagram of an embodiment of a semiconductor device.

FIG. 18 is a schematic diagram of an embodiment of a semiconductor device.

Referring to FIG. 18, the semiconductor device according to the current embodiment is different from the semiconductor device according to the embodiment of FIG. 10 in that pattern generating circuit 120 provides a data pattern PTN to a plurality of scan chains 200 and 202, and analyzing circuits 130 and 132 process result patterns OUT output from SO terminals of scan chains 200 and 202 in response to the data patterns PTN, respectively.

That is, analyzing circuit 130 may ascertain or measure the degree of degradation of an IP block corresponding to scan chain 200 by counting the number of transitions in the result pattern OUT output from the SO terminal of scan chain 200 in response to the data pattern PTN input to scan chain 200.

In addition, analyzing circuit 132 may ascertain or measure the degree of degradation of an IP block corresponding to scan chain 202 by counting the number of transitions in the result pattern OUT output from the SO terminal of scan chain 202 in response to the data pattern PTN input to scan chain 202 different from scan chain 200.

Figure 19:
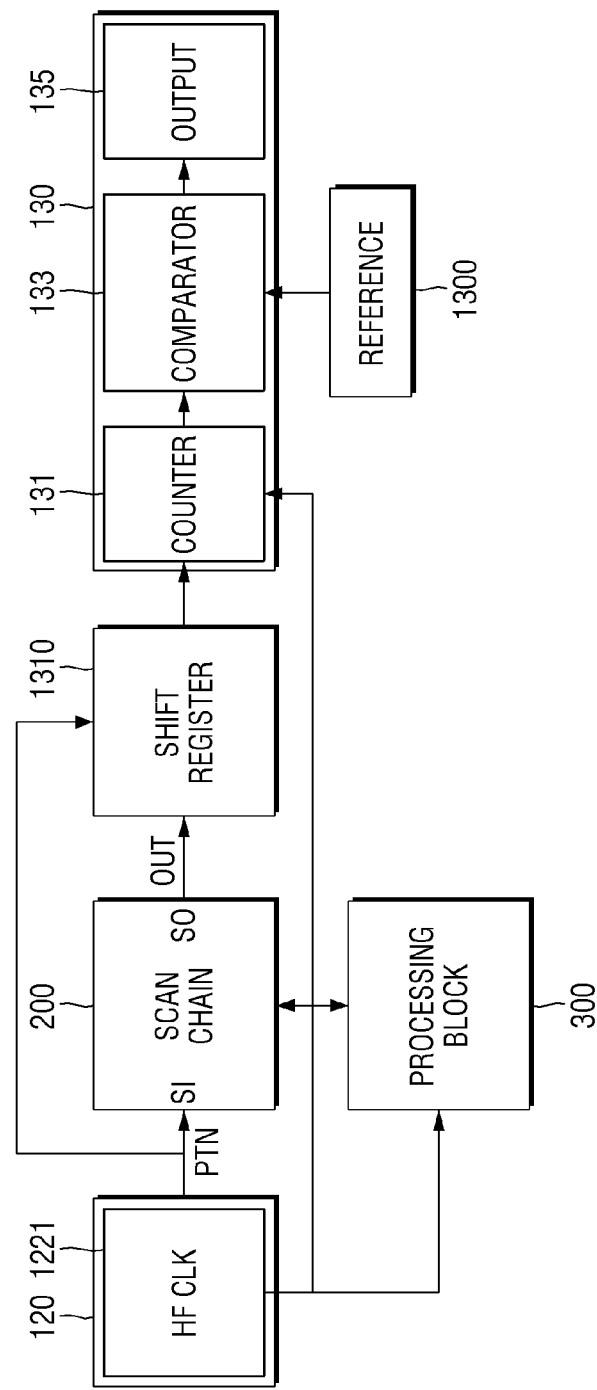
FIGS. 19, 20 and 21 are schematic diagrams of an embodiment of a semiconductor device.
Figure 20:
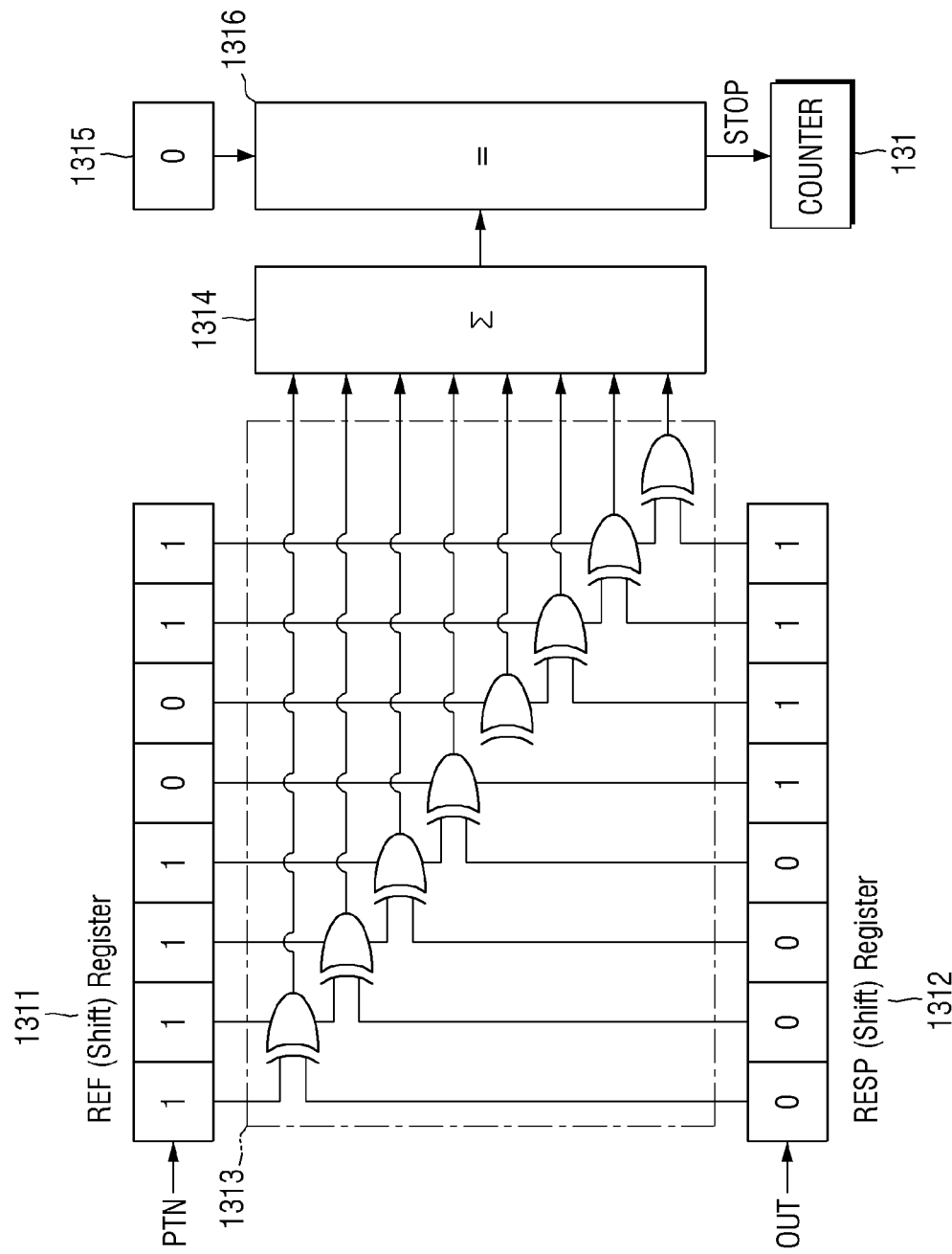
Figure 21:
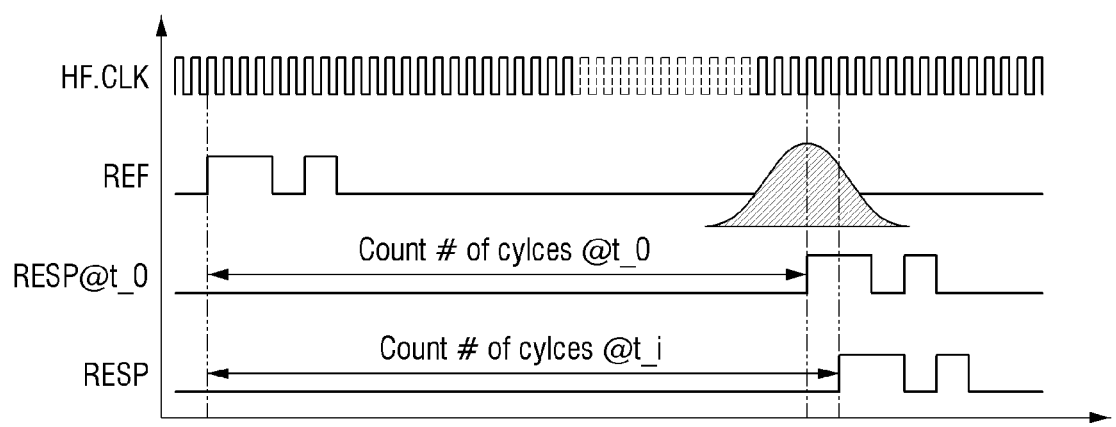

FIGS. 19 through 21 are schematic diagrams of an embodiment of a semiconductor device.

Referring to FIGS. 19 through 21, the semiconductor device according to the current embodiment is different from the semiconductor device according to the embodiment of FIG. 14 in that a shift register 1310 is further disposed between scan chain block 200 and a counter 131, a clock signal output from a high frequency clock generator 1221 is provided to counter 131, and a data pattern PTN output from pattern generating circuit 120 is provided to shift register 1310.

Shift register 1310 may include an REF shift register 1311 to which the data pattern PTN output from pattern generating circuit 120 is directly input, an REFP shift register 1312 to which a result pattern OUT output from an SO terminal of scan chain block 200 is input, a logic circuit 1313 which includes a plurality of logic gates for performing logical operations on values stored in REF shift register 1311 and REFP shift register 1312, and a summation circuit 1314 which sums the results of logic circuit 1313, and a comparison circuit 1316 which compares the result of summation circuit 1314 with a reference value 1315.

Comparison circuit 1316 may provide a count stop signal STOP to counter 131 according to the result of comparing reference value 1315 with the result of summation circuit 1314.

The degree of degradation of an IP block can be ascertained or measured by using shift register 1310 by comparing the number of cycles of REFP shift register 1312 at a time t_0 with the number of cycles of REFP shift register 1312 at a time t_i.

Figure 22:
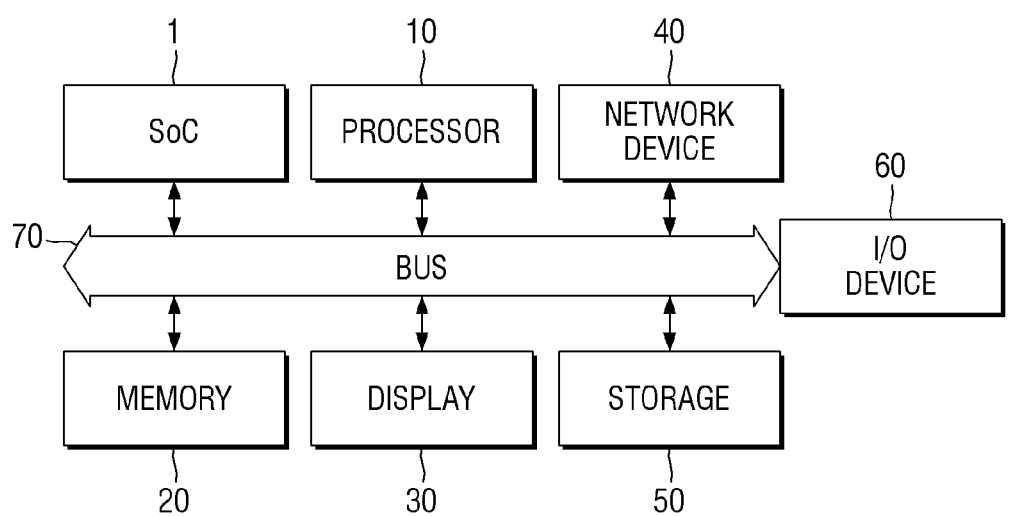
FIG. 22 is a schematic diagram of an embodiment of a semiconductor system.

FIG. 22 is a schematic diagram of an embodiment of a semiconductor system.

SoC 1 according to the various embodiments described so far may form a semiconductor system by being connected to a processor 10, a memory 20, a display 30, a network device 40, a storage 50 and an I/O device 60 through a bus 70.

In addition, a semiconductor device according to the various embodiments described so far can ascertain or measure the degree of degradation of an IP block using a scan chain block 200 already provided in SoC 1 for defect inspection without requiring a separate measuring device such as a PVT sensor. Therefore, the area of the product is not additionally increased, and the power consumed by the separate measuring device can be saved.

In addition, when the degree of degradation of an IP block is measured using a separate measuring device such as a PVT sensor, the accuracy of the degradation measurement is inevitably lowered due to the physical distance between a point where the separate measuring device measures the degree of degradation and a point where the IP block is located. On the other hand, since the semiconductor device according to the various embodiments uses scan chain block 200 formed immediately adjacent to an IP block of the SoC 1, errors due to the physical distance are significantly reduced. Thus, more accurate degradation measurement is possible.

Furthermore, as described above with reference to FIG. 7, it is not only possible to more finely measure the degree of degradation of only a desired IP block among one or more IP blocks included in processing block 300, but also possible to adjust a driving voltage for an element according to the finely measured degree of degradation of the element, thereby extending the life of the SoC.

In concluding the detailed description, those skilled in the art will appreciate that many variations and modifications can be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor device, comprising:
a processing block which includes one or more intellectual property (IP) blocks;
a scan chain block which is electrically connected to the one or more IP blocks, wherein the scan chain block has a scan in (SI) terminal and a scan out (SO) terminal;
a pattern generating circuit which is configured to generate a data pattern having a plurality of bits and to input the data pattern to the scan in (SI) terminal of the scan chain block; and
an analyzing circuit which is configured to ascertain a degree of degradation of each of the one or more IP blocks based on a result pattern output from the scan out (SO) terminal of the scan chain block.

2. The semiconductor device of claim 1, wherein the data pattern comprises a bit pattern in which a first value and a second value are repeated regularly, and the analyzing circuit is configured to ascertain the degree of degradation of each of the one or more IP blocks by comparing the bit pattern input to the SI terminal with the result pattern output from the SO terminal.

3. The semiconductor device of claim 1, wherein the pattern generating circuit is configured to input to the SI terminal the data pattern having an overclock frequency for provoking a fail of each of the IP blocks, and the analyzing circuit is configured to ascertain the degree of degradation of each of the IP blocks based on the result pattern output from the SO terminal.

4. The semiconductor device of claim 1, wherein the pattern generating circuit is configured to generate a first data pattern having a first frequency and a second data pattern having a second frequency different from the first frequency and inputs the first data pattern and the second data pattern to the SI terminal, and the analyzing circuit is configured to ascertain the degree of degradation of each of the one ore more IP blocks based on a first result pattern output from the SO terminal in response to the first data pattern having the first frequency and a second result pattern output from the SO terminal in response to the second data pattern having the second frequency.

5. The semiconductor device of claim 1, wherein the analyzing circuit is configured to ascertain the degree of degradation of each of the one or more IP blocks by comparing a first result pattern obtained from the SO terminal at a first time with a second result pattern obtained from the SO terminal at a second time different from the first time.

6. The semiconductor device of claim 1, wherein the pattern generating circuit includes a high frequency clock generator, and is configured to generate the data pattern using a clock signal output from the high frequency clock generator, and to provide the clock signal output from the high frequency clock generator to the processing block.

7. The semiconductor device of claim 1, further comprising a frequency control circuit which is configured to adjust a frequency of a clock signal provided to each of the one or more IP blocks based on the ascertained degree of degradation.

8. The semiconductor device of claim 1, further comprising a voltage control circuit which is configured to adjust a driving voltage provided to each of the one or more IP blocks based on the ascertained degree of degradation.

9. The semiconductor device of claim 1, wherein the one or more IP blocks comprise a first IP block and a second IP block, wherein the scan chain block comprises a first scan chain electrically connected to the first IP block and a second scan chain electrically connected to the second IP block, and wherein the analyzing circuit is configured to ascertain one of: the degree of degradation of the first IP block by inputting the data pattern to the first scan chain, and the degree of degradation of the second IP block by inputting the data pattern to the second scan chain.

10. The semiconductor device of claim 1, wherein the one or more IP blocks comprise a first IP block in an active state and a second IP block in an idle state, wherein the scan chain comprises a first scan chain electrically connected to the first IP block and a second scan chain electrically connected to the second IP block, and wherein the analyzing circuit is configured to ascertain the degree of degradation of the second IP block by inputting the data pattern only to the second scan chain.

11. A semiconductor device, comprising:
a processing block which comprises a first intellectual property (IP) block and a second IP block;
a scan chain block which comprises a first scan chain electrically connected to the first IP block and a second scan chain electrically connected to the second IP block; and
a sensing circuit which is configured to measure a first degree of degradation of the first IP block by providing a first data pattern to the first scan chain and then analyze a first result pattern output by the first scan chain in response to the first data pattern, and to measure a second degree of degradation of the second IP block by providing a second data pattern to the second scan chain and then analyzing a second result pattern output by the second chain in response to the second data pattern.

12. The semiconductor device of claim 11, wherein the sensing circuit comprises:
a pattern generating circuit which is configured to generate the first data pattern and the second data pattern and to input the first data pattern and the second data pattern to a scan in (SI) terminal of the scan chain block; and
an analyzing circuit which is configured to measure the first degree of degradation of the first IP block and the second degree of degradation of the second IP block based on the first and second result patterns output from a scan out (SO) terminal of the scan chain block.

13. The semiconductor device of claim 12, wherein each of the first data pattern and the second data pattern comprises a bit pattern in which a first value and a second value are repeated regularly, and the analyzing circuit is configured to measure the first degree of degradation of the first IP block by comparing the bit pattern with the first result pattern output from the SO terminal and is further configured to measure the second degree of degradation of the second IP block by comparing the bit pattern with the second result pattern output from the SO terminal.

14. The semiconductor device of claim 11, wherein the sensing circuit further comprises a frequency control circuit which is configured to adjust a frequency of a clock signal provided to each of the first IP block and the second IP block based on the measured first and second degrees of degradation.

15. The semiconductor device of claim 11, wherein the sensing circuit further comprises a voltage control circuit which is configured to adjust a driving voltage provided to each of the first IP block and the second IP block based on the measured first and second degrees of degradation.

16. A semiconductor device, comprising:
a processing block which comprises one or more intellectual property (IP) blocks;

a scan chain block which is electrically connected to the IP blocks wherein the scan chain block has a scan in (SI) terminal and a scan out (SO) terminal;

a pattern generating circuit which is configured to generate a first data pattern having a first frequency and a second data pattern having a second frequency different from the first frequency and to provide the first data pattern and the second data pattern to the SI terminal of the scan chain block; and an analyzing circuit which is configured to ascertain a degree of degradation of each of the IP blocks based on a first result pattern and a second result pattern output from the SO terminal of the scan chain block.

17. The semiconductor device of claim 16, wherein the pattern generating circuit is configured to input to the SI terminal a third data pattern having an overclock frequency for provoking a fail of each of the IP blocks, and the analyzing circuit is configured to ascertain the degree of degradation of each of the IP blocks based on a third result pattern output from the SO terminal.

18. The semiconductor device of claim 16, wherein the analyzing circuit is configured to ascertain the degree of degradation of each of the IP blocks by comparing a first-time result pattern obtained from the SO terminal at a first time with a second-time result pattern obtained from the SO terminal at a second time different from the first time.

19. The semiconductor device of claim 16, wherein the pattern generating circuit comprises a high frequency clock generator, and is configured to generate the first data pattern and the second data pattern using a clock signal output from the high frequency clock generator, and to provide the clock signal output from the high frequency clock generator to the processing block.

20. The semiconductor device of claim 16, wherein the IP blocks comprise a first IP block in an active state and a second IP block in an idle state, wherein the scan chain block comprises a first scan chain electrically connected to the first IP block and a second scan chain electrically connected to the second IP block, and wherein the analyzing circuit is configured to ascertain the degree of degradation of the second IP block by inputting a data pattern only to the second scan chain.

* * * * *